United States Patent
Touwslager et al.

(10) Patent No.: US 8,030,124 B2
(45) Date of Patent: Oct. 4, 2011

(54) METHOD FOR PATTERNING AN ORGANIC MATERIAL TO CONCURRENTLY FORM AN INSULATOR AND A SEMICONDUCTOR AND DEVICE FORMED THEREBY

(75) Inventors: Fredericus J. Touwslager, Veldhoven (NL); Gerwin H. Gelinck, Valkenswaard (NL)

(73) Assignee: Creator Technology B.V., Breda (NL)

( * ) Notice: Subject to any disclaimer, the term of this patent is extended or adjusted under 35 U.S.C. 154(b) by 990 days.

(21) Appl. No.: 11/718,332

(22) PCT Filed: Nov. 2, 2005

(86) PCT No.: PCT/IB2005/053583
§ 371 (c)(1),
(2), (4) Date: May 1, 2007

(87) PCT Pub. No.: WO2006/048833
PCT Pub. Date: May 11, 2006

(65) Prior Publication Data
US 2008/0246024 A1  Oct. 9, 2008

Related U.S. Application Data

(60) Provisional application No. 60/625,672, filed on Nov. 5, 2004.

(51) Int. Cl.
*H01L 21/00* (2006.01)

(52) U.S. Cl. .......................................... 438/99; 438/30

(58) Field of Classification Search .................... 438/30, 438/99, 151–166
See application file for complete search history.

(56) References Cited

U.S. PATENT DOCUMENTS

| | | |
|---|---|---|
| 6,489,046 B1 | 12/2002 | Ikeda et al. |
| 6,500,604 B1 | 12/2002 | Dimitrakopoulos et al. |
| 2003/0105365 A1 | 6/2003 | Smith et al. |
| 2003/0136964 A1 | 7/2003 | Afzali-Ardakani et al. |
| 2004/0119073 A1 | 6/2004 | Ardakami et al. |

FOREIGN PATENT DOCUMENTS
WO   WO0145469   6/2001

OTHER PUBLICATIONS

Jurchescu et al., "Effect of Impurities on the Mobility of Single Crystal Pentacene," Applied Physics Letters, AIP, American Institute of Physics, vol. 84, No. 16, pp. 2061-3063; Apr. 19, 2009.

(Continued)

*Primary Examiner* — Richard A. Booth

(57) ABSTRACT

A method for fabricating an electronic device includes forming a layer of precursor material for forming a semi-conductor material in a cured state and exposing the precursor material to light. The precursor is heated in the presence of the light to form an insulator in areas exposed to light and a semiconductor in areas not exposed to the light. The light is preferably in the visible range. Suitable precursors may include 6,13-dihydro-6,13-(2,3,4,5-tetrachloro-2,4-cyclohexadieno)-pentacene (202) to form, for example, pentacene (204) as the semiconductor and 6,13-pentacenequinone (206) as an insulator. A device made in accordance with the method is also included.

10 Claims, 6 Drawing Sheets

OTHER PUBLICATIONS

Herwig et al., "A Soluble Pentacene Precursor: Synthesis, Solid-State Conversion Into Pentacene and Application in a Field-Effect Transistor," Advanced Materials, vol. 11, No. 6, pp. 480-483, Apr. 16, 1999.

Gelinck et al, "Flexible Active-Matrix Displays and Shift Registers Based on Solution-Processed Organic Transistors", Nature Materials/Advanced Online Publications/www.nature.com/naturematerials, pp. 1-5, 2003.

Huitema et al, "A Flexible QVGA Display With Organic Transistors", Proc. IDW 2003, pp. 1663-1664.

Afzali et al, "Photosensitive Pentacene Precursor: Synthesis, Photothermal Patterning, and Application in Thin-Film Transistors", Advanced Materaials, 2003, 15, No. 24, pp. 2066.

Weidkamp et al, "A Photopatternable Pentacene Precursor for Use in Organic Thin-Film Transistors", J. Am. Chem. Soc., 2004, 126, pp. 12740-12741.

METHOD FOR PATTERNING AN ORGANIC MATERIAL TO CONCURRENTLY FORM AN INSULATOR AND A SEMICONDUCTOR AND DEVICE FORMED THEREBY

CROSS REFERENCE TO RELATED CASES

Applicants claim the benefit of U.S. Provisional Application Ser. No. 60/625,672, filed. Nov. 5, 2004 and International Application Number PCT/IB2005/053583, filed Nov. 2, 2005.

This disclosure relates to semiconductor technology and more particularly, to methods for patterning organic materials to form both an insulator and a semiconductor in a same precursor at the same time, and devices formed by employing these methods.

Organic electronics may be employed in making flexible active matrix back planes for display applications. These back planes, which employ organic materials, are capable of supporting circuits and electrical devices, such as shift registers (See, e.g., Gelinck, G. H. et al, *Nature Mat.* (2004), 3, 106, incorporated herein by reference). These active matrices may be combined with an electrophoretic display effect to obtain a flexible display (See, e.g., Huitema, H. E. A. et al., *Proc. IDW*(2003), 1663-4, incorporated herein by reference). An organic semi-conductor may be provided for these applications, but the organic semi-conductor material has to be structured to obtain the desired performance of the transistors.

Structuring of the semiconductor is complicated and often entails a multiple step process. In general, the process includes that a precursor of the semi-conductor is applied by spin coating. This precursor is then converted to the semiconductor during a heating step. This semiconductor is subsequently structured by applying a resist, illuminating the resist and developing the resist. After this, the semiconductor is removed locally by a reactive ion etch (RIE) step, and optionally the photoresist is removed.

An alternative method is described by Afzali et. al. in Adv. Mater. (2003) 15, 2066, incorporated herein by reference. Afzali uses a photosensitive pentacene precursor. One disadvantage of this method is that the photoproducts formed negatively affect the transistor performance.

A method for fabricating an electronic device includes forming a layer of precursor material for forming a semiconductor material in a cured state and exposing the precursor material to light. The precursor is heated in the presence of the light to form an insulator in areas exposed to light and a semiconductor in areas not exposed to the light. The light is preferably in the visible range. Suitable precursors may include 6,13-dihydro-6,13-(2,3,4,5-tetrachloro-2,4-cyclohexadieno)-pentacene to form, for example, pentacene as the semiconductor and 6,13-pentacenequinone as an insulator. The precursor may include 6,13-dihydro-6,13-(2,3,4,5-tetrabromo-2,4-cyclohexadieno)-pentacene, a larger acene precursor, and/or a nonacene precursor.

These and other objects, features and advantages of the present disclosure will become apparent from the following detailed description of illustrative embodiments thereof, which is to be read in connection with the accompanying drawings.

This disclosure will present in detail the following description of preferred embodiments with reference to the following figures wherein.

Figure 1:
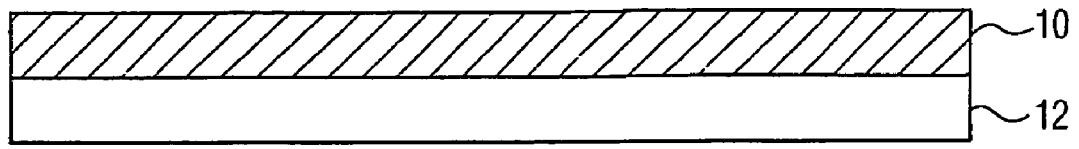
FIG. 1 is a cross-sectional view of a substrate having a precursor material formed thereon in accordance with one embodiment of the present disclosure.

The present disclosure describes an efficient way to pattern organic materials. In one preferred embodiment, pentacene is patterned. Pentacene is a semiconductor material, which has many advantages for semiconductor performance. For example, pentacene may be applied from solution in the form of a precursor, and then converted to pentacene and structured using standard photolithography techniques in combination with a reactive ion etch (RIE). The RIE etch is particularly cumbersome, yet needed since pentacene is insoluble in practically every practical solvent.

The present disclosure makes use of the observation that under light exposure (at elevated temperatures) oxides, such as, 6,13-pentacenequinone are formed from the precursor instead of pentacene. 6,13-pentacenequinone is not semiconducting. Thus, a method is presented in which semiconducting pentacene islands are formed embedded in an amorphous transparent insulator matrix, making the deposition of additional photoresists and the RIE etch process obsolete or unnecessary.

Methods for fabricating a semiconductor structure are illustratively shown with reference to FIGS. 1-4. Referring now in specific detail to the drawings in which like reference numerals identify similar or identical elements throughout the several views, and initially to FIG. 1, a layer of precursor pentacene 10 is spun unto a substrate 12. The precursor 10 may include 6,13-dihydro-6,13-(2,3,4,5-tetrachloro-2,4-cyclohexadieno)-pentacene, and/or 6,13-dihydro-6,13-(2,3,4,5-tetrabromo-2,4-cyclohexadieno)-pentacene, which may be custom made by SYNCOM™, in the Netherlands.

Substrate 12 may include a semiconductor material, transparent conductor or other material depending on the application for the completed device. Since the precursor material 10 is preferably in a liquid state, material 10 is easily applied to substrate 12 by spin coating; however, other application processes are also contemplated.

Figure 2:
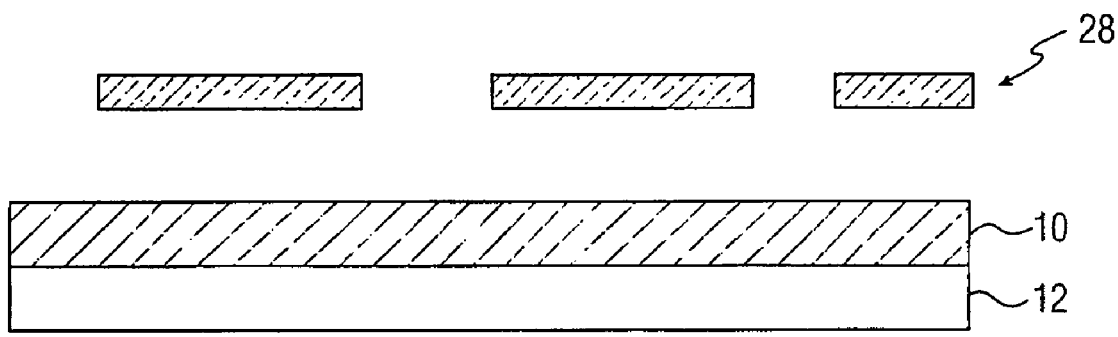
FIG. 2 is a cross-sectional view of the substrate of FIG. 1 having a mask for selective exposure of the precursor material in accordance with one embodiment of the present disclosure.
Figure 3:
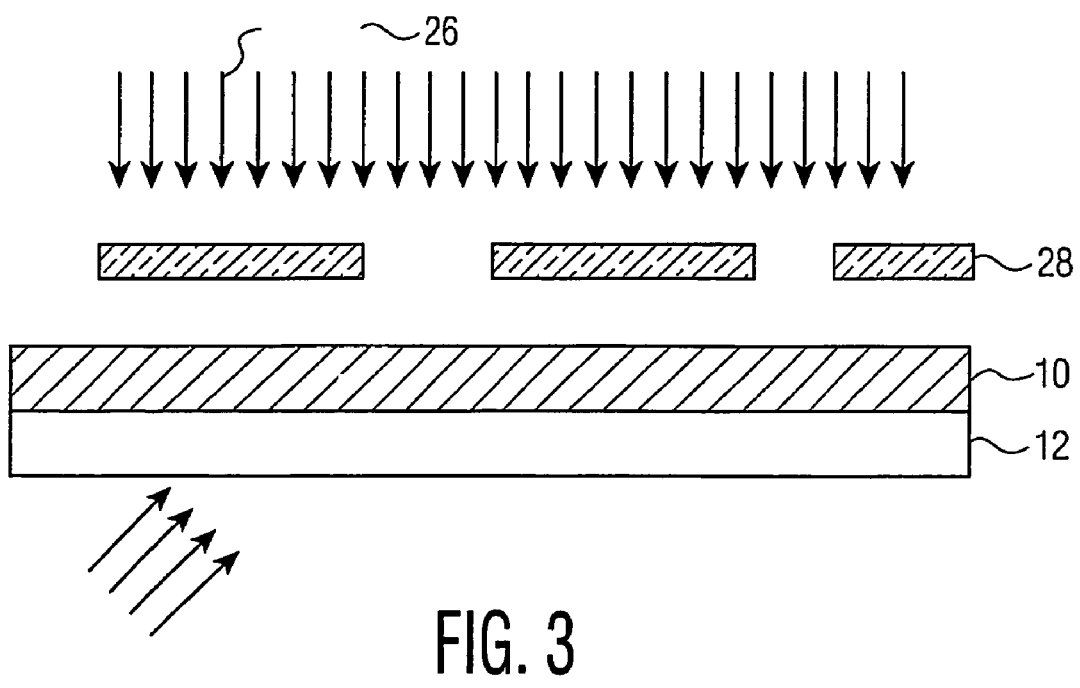
FIG. 3 is a cross-sectional view of the substrate of FIG. 2 showing the exposure to light and the heat processes of the precursor material in accordance with one embodiment of the present disclosure.

Referring to FIGS. 2 and 3, precursor 10 is heated in the presence of visible light; however, UV light or IR light can also be used. By exposing, precursor 10 to light during a heating step, the conversion of precursor pentacene to pentacene is influenced. Light 26 (FIG. 3) may be masked by a mask 28, to pattern precursor 10 during semiconductor processing. This permits semiconductor structures to be formed simultaneously with insulating structures in a same material being processed.

During this method, precursor pentacene is converted to an oxide or quinone, and, in particular, 6,13-pentacenequinone, which is an oxidized form of pentacene. 6,13-pentacenequinone is an insulator and not a conducting or semiconducting material. As such, a plurality of advantages can be provided as a result of these qualities, as would be apparent to one skilled in the art with knowledge of the present disclosure.

Heat sufficient to cause the conversion of precursor 10 in the presence of oxygen to pentacene may include applying a temperature of above about 150 degrees Celsius for a sufficient duration, say for example, at least 5 seconds or more, other recipes for conversion may also be employed, for example, 200° C. for about 10 seconds, etc. Higher temperatures may have ill effects on other electronic devices or materials. Higher or lower temperatures may be employed and application times adjusted according to the temperature selected. Ambient oxygen or even more or less concentrations of oxygen are sufficient to form the oxide. Additionally, low light intensities, for example, bulb light intensities (say about 5-60 Watts) are sufficient to alter the conversion of precursor 10 to pentacene. Incident intensities are preferably in the range of between about 0.1 mW/cm$^2$ and about 1 W/cm$^2$ for white light. A wide band of light from IR through visible to UV may be employed to provide the conversion.

Figure 4:
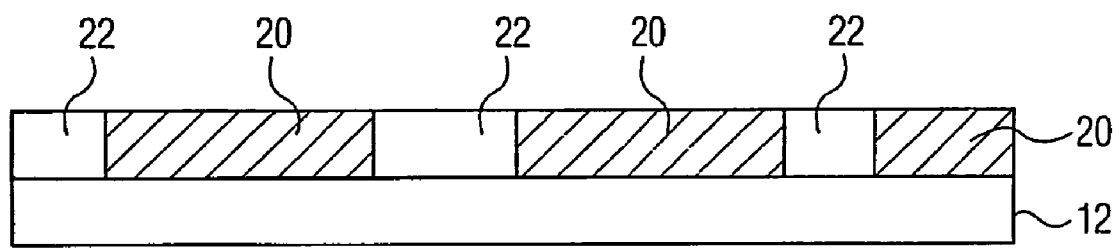
FIG. 4 is a cross-sectional view of the substrate of FIG. 3 after the formation of insulator portions and semiconductor portions in accordance with one embodiment of the present disclosure.

Referring to FIG. 4, pentacene 20 is formed in areas where light was absent and 6,13-pentacenequinone 22 is formed in areas where light was present during the heating step. In this way, semiconducting areas 20 (pentacene) and insulating areas 22 (6,13-pentacenequinone) are simultaneously formed in a same layer 11. Pentacene forms a polycrystalline (hence, light scattering) film with a purple color, while 6,13-pentacenequinone is transparent and amorphous and thus does not give any contrast. Patterned areas 20 and 22 may be employed to form electronic components such as transistors, diode, or even horizontally disposed capacitors. Other devices and components may also be formed in accordance with this disclosure.

In accordance with the present disclosure, patterning a pentacene precursor permits a manufacturer to eliminate resist structuring (and removal) and etching (e.g., RIE etch), and replace these with a simple pattern-wise illumination during the conversion step (e.g., precursor to pentacene). The present inventors have found that an illumination (with white light, but also with visible (e.g., yellow light), UV or IR) at modest light intensities during the temperature (heating) step, influences the conversion of the precursor pentacene to pentacene such that in the presence of light, the "normal" retro Diels-Alder (leading to pentacene) does not take place, but the oxidized form of pentacene(6,13-pentacenequinone) is formed, which is an insulator instead of a (semi-) conductor.

Figure 5:
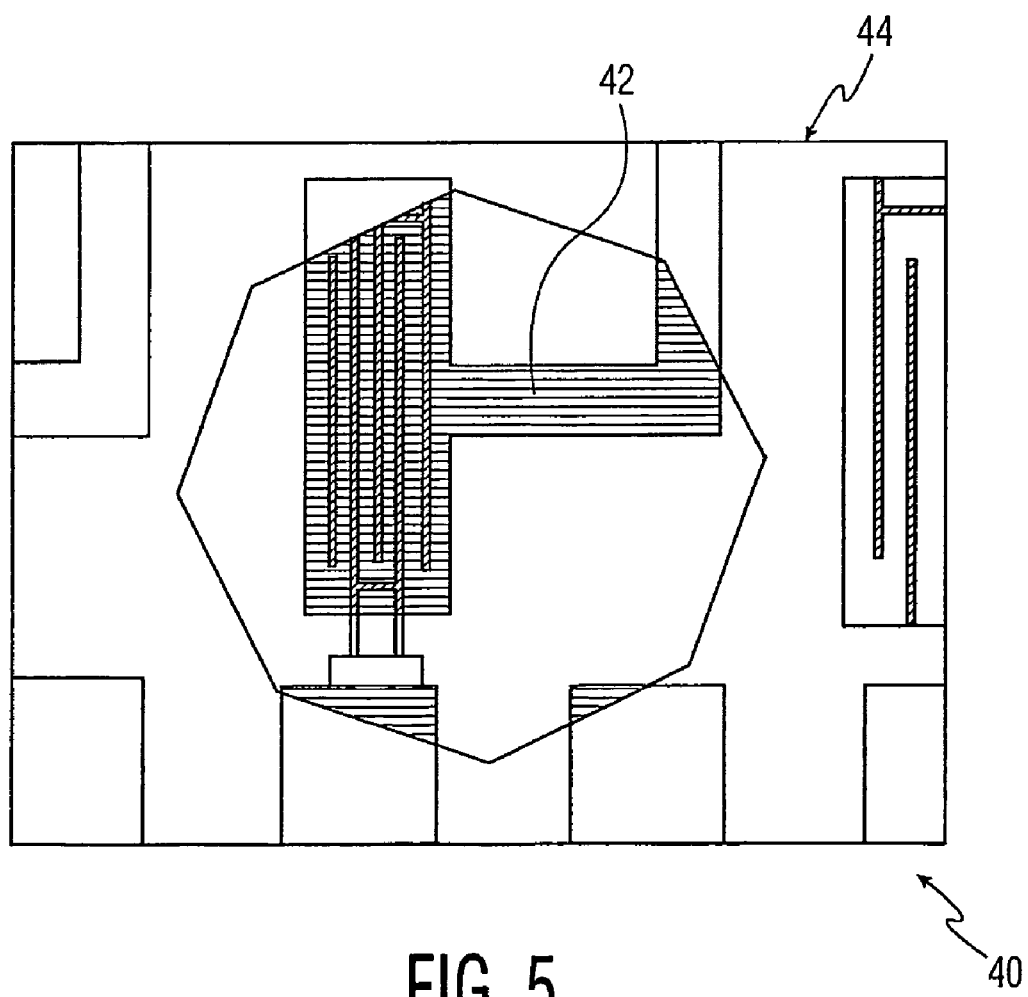
FIG. 5 is a top view of an electronic showing an insulator portion and a semiconductor portion in accordance with one experimental embodiment of the present disclosure.
Figure 6:
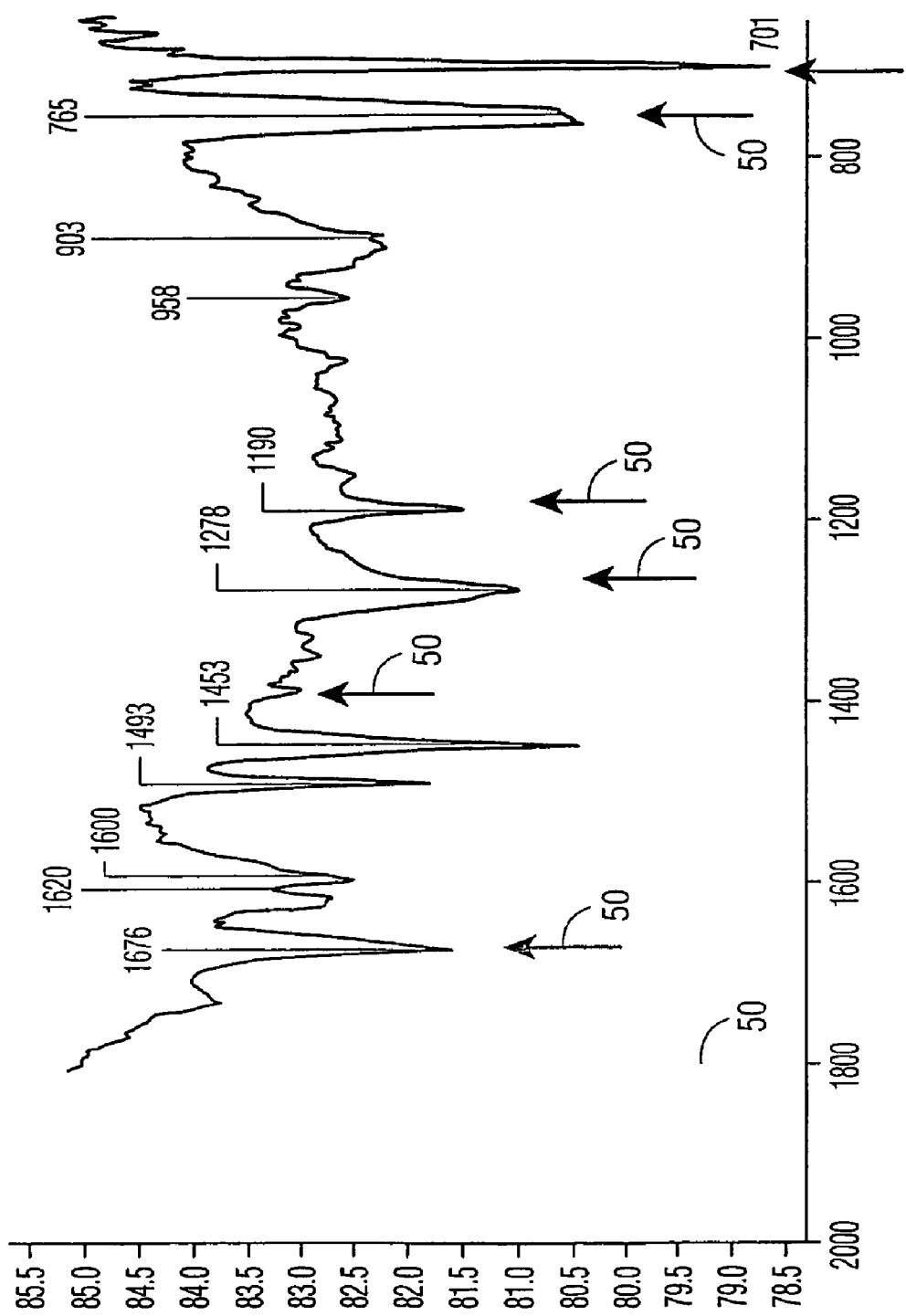
FIGS. 6 and 7 show spectrographs demonstrating material characteristics for the structure of FIG. 5 in accordance with the present disclosure.
Figure 7:
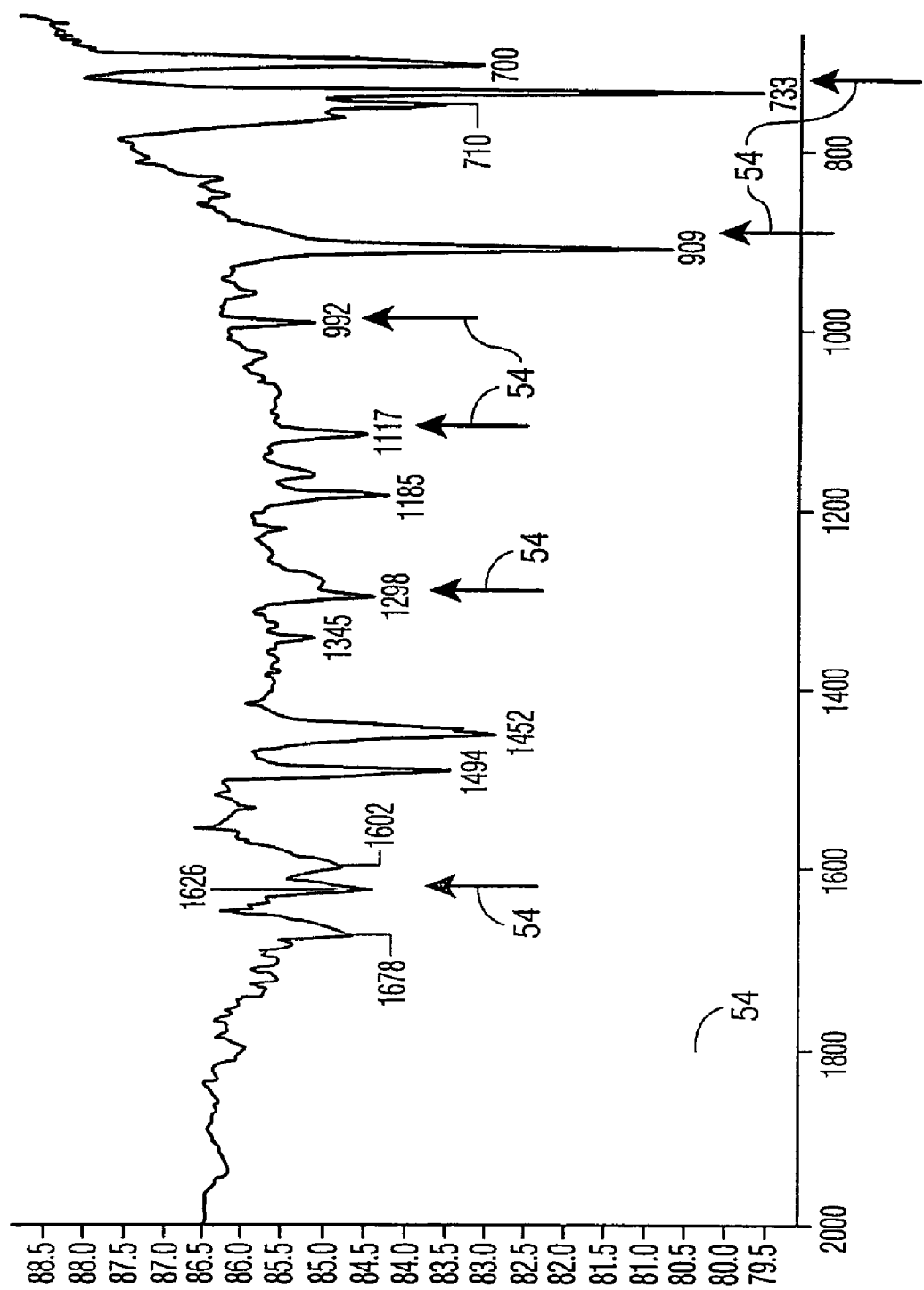

This is demonstrated in FIGS. 5-7 in an experiment conducted by the present inventors. Referring to FIG. 5, a pentacene precursor material 10 was spun onto an electronic device 40. A given area 42 was exposed to white light while ramping up the temperature using a hot plate. In absence of the light, pentacene is formed in area 44. The pentacene in area 44 formed a polycrystalline (hence, light scattering) film with a purple color, in this case. The 6,13-pentacenequinone in area 42 formed in the illuminated area and is transparent and amorphous and thus does not give any contrast.

Referring to FIG. 6, reflectance versus wave numbers are shown for the material in area 42 ("inside spot") of FIG. 5. Arrows 50 indicate points of interest for 6,13-pentacenequinone (quinone). The spectrum demonstrates the formation of 6,13-pentacenequinone inside the spot in area 42.

Referring to FIG. 7, reflectance versus wave numbers are shown for the material in area 44 ("outside spot") of FIG. 5.

Arrows 54 indicate points of interest for 6,13-pentacenequinone. The spectrum demonstrates the formation of 6,13-pentacenequinone outside the spot in area 44.

The present disclosure may find utility in many different devices and manufacturing procedures. One procedure for fabricating polymer transistors may be found in G. H. Gelinck et al, *Nature Materials,* 3, 106-110. This procedure may be followed up to the step in which precursor pentacene film is spin coated, as described above.

Figure 8:
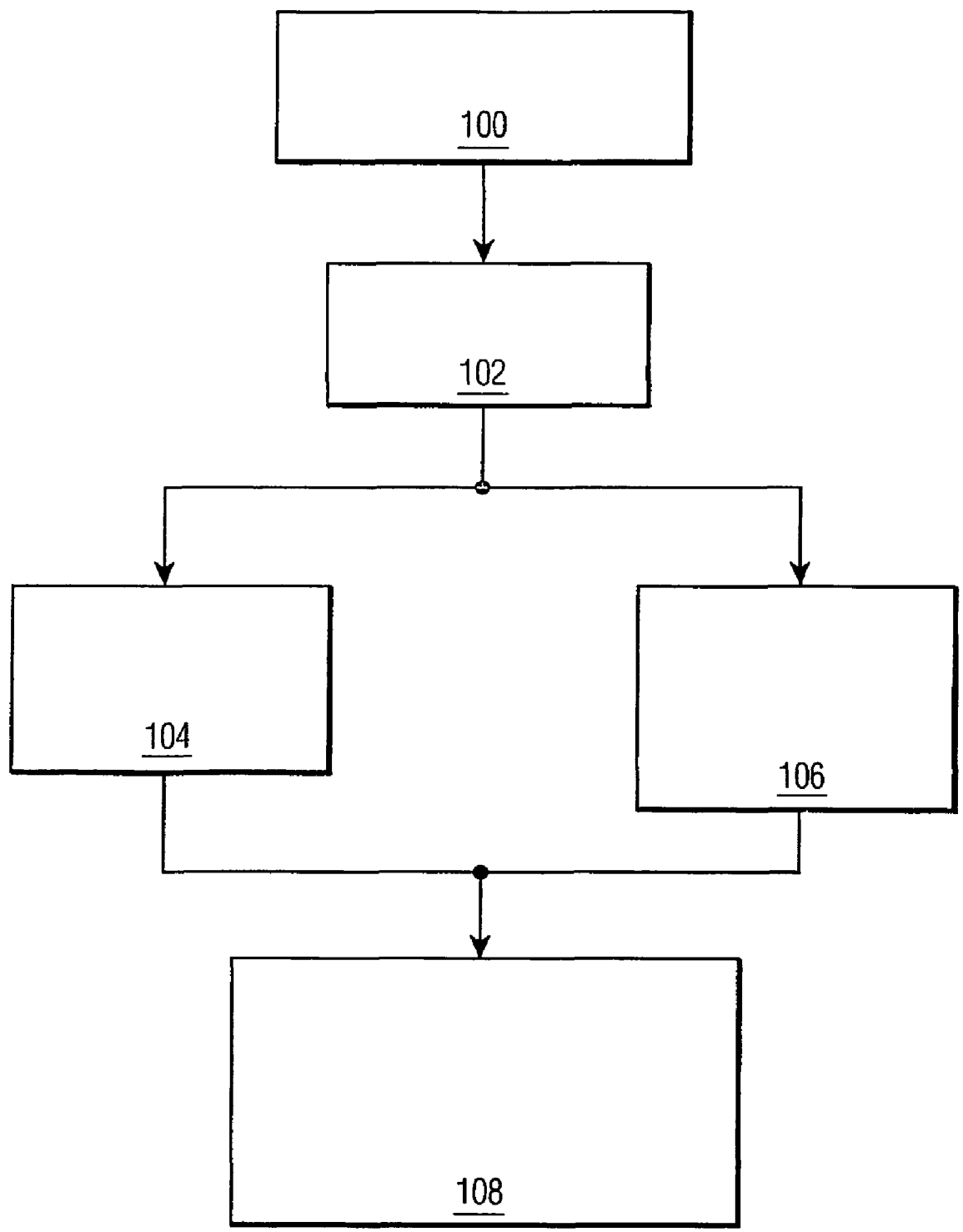
FIG. 8 is a block diagram showing method steps for fabricating a semiconductor device in accordance with the present disclosure.

Alternative methods for making transistors in which pentacene islands are embedded in an amorphous matrix of the quinone will now be generally described. Referring to FIG. 8, in block 100, a surface or substrate is prepared for the application of a pentacene precursor. This may include the procedures outlined in G. H. Gelinck et. al., as referenced above. In block 102, the precursor is formed on the surface. This may be performed by spin coating the surface, although other methods may be employed depending on the application.

In block 104, the layer of precursor is exposed locally to light through a mask at elevated temperatures. The light is preferably white light or yellow light, however, UV or IR can be used as well. In one embodiment, coherent light from a laser or diode may be preferred for increasing the resolution of the projected image. Other image producing techniques may also be employed.

Alternately, in block 106, the precursor material is heated up locally by a light source (laser, infrared (IR) lamp, etc.), which may expose and heat portions of the precursor simultaneously, thus forming the 6,13-pentacene quinone. This step needs a normal heating step to form pentacene in non-illuminated areas.

In either case, the exposure of the precursor is best applied in an environment where oxygen is present such that a quinone is formed. In either case, the precursor layer can be patterned down to dimensions of about tenths of micrometers or less, e.g., sufficient for use in integrated circuits and active matrix displays, and in particular flexible displays and polymer electronics devices.

It is to be understood that the present disclosure have been described in terms of pentacene and its oxides, but the teachings herein may be extended to other compounds and chemicals in the oligocene group, such as for example, 7,16-dihydro-7,16-(2,3,4,5-tetrachloro-2,4-cyclohexadieno)-heptacene, which form oxides 7,16-heptacene quinone in the presence of light. Furthermore, larger acene precursors may be employed. The insulators formed may include larger sibling molecules of 6,13-pentacene as well (this depends upon the type of starting precursor used).

Figure 9:
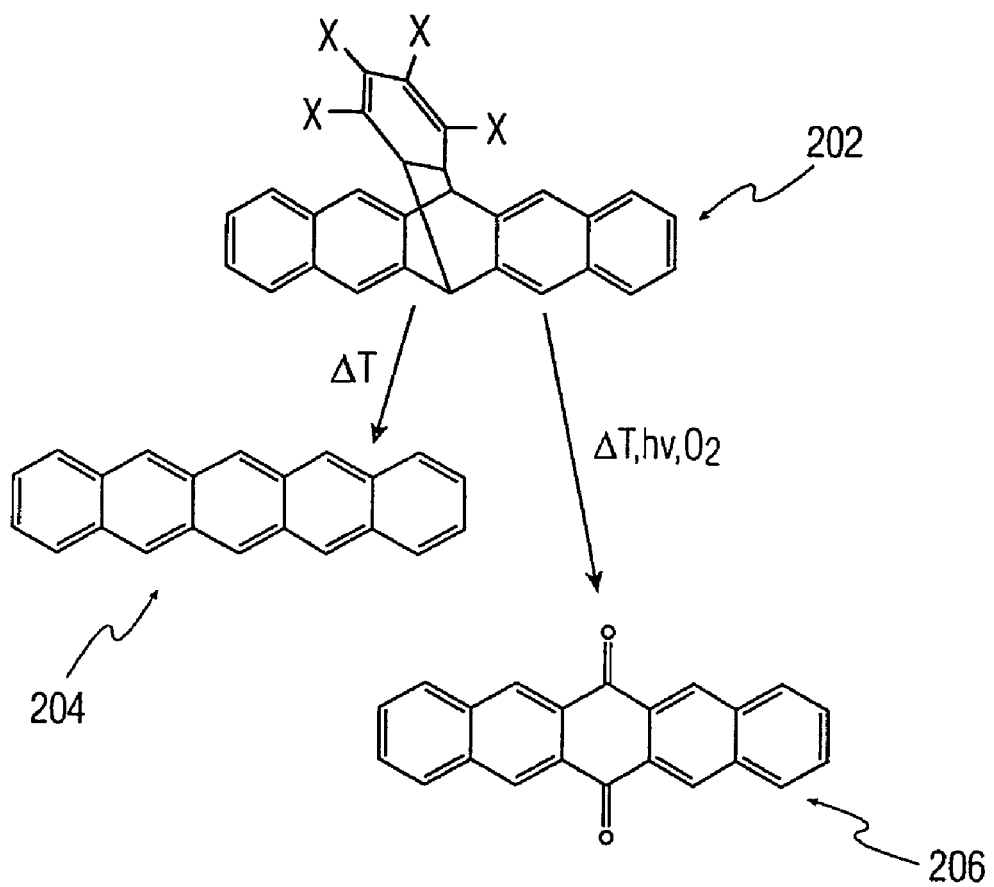
FIG. 9 is a diagram showing an illustrative chemical structure for a precursor material and its formation into an insulator and a semiconductor material in accordance with one aspect of the present disclosure.
Figure 10:
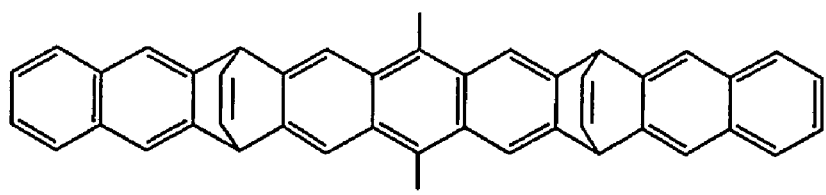
FIG. 10 is a diagram showing an illustrative chemical structure for an alternative precursor material in accordance with one aspect of the present disclosure.

A chemical diagram of a preferred embodiment will now be illustratively described. Referring to FIG. 9, a precursor molecule 202 is illustratively shown forming different states in accordance with the present disclosure. Molecule 202 is a halogenated molecule, and the preferred halogens are chlorine and bromine (e.g., X=Cl and/or Br). It is not necessary that all substitutions are the same halogen, although tetra chloro is preferred. Another structure shown in FIG. 10 may also be employed and the same process used as described herein With reference to FIG. 9, in a first instance, molecule 202 is converted to pentacene 204 under increased temperature ($\Delta T$). In a second instance, in the presence of heat ($\Delta T$), light (hv) and oxygen ($O_2$), the precursor 202 forms a quinone, such as 6,13-pentacenequinone 206.

Having described preferred embodiments for method for patterning an organic material and device formed thereby (which are intended to be illustrative and not limiting), it is noted that modifications and variations can be made by persons skilled in the art in light of the above teachings. It is therefore to be understood that changes may be made in the particular embodiments of the disclosure disclosed which are within the scope and spirit of the embodiments disclosed herein as outlined by the appended claims. Having thus described the details and particularity required by the patent laws, what is claimed and desired protected by Letters Patent is set forth in the appended claims.

The invention claimed is:

1. A method for fabricating an electronic device, comprising the steps of:
   forming a layer of precursor material for forming a semiconductor material in a cured state; and
   heating the precursor in the presence of light and ambient oxygen to form an insulator in areas exposed to light and a semiconductor in areas not exposed to the light, wherein the precursor is a pentacene precursor, and the pentacene precursor is patterned in the presence of light and ambient oxygen, thereby forming an oxide of pentacene without performing additional steps of depositing photoresist and applying a reactive ion etch.

2. The method as recited in claim 1, wherein the step of heating includes exposing the precursor material to light in the visible, UV and/or IR region.

3. The method as recited in claim 2, wherein the light includes white light having an intensity of between about 0.1 mW/cm$^2$ and 1 W/cm$^2$.

4. The method as recited in claim 1, wherein the step of heating includes exposing the precursor material to light and heat simultaneously using a laser.

5. The method as recited in claim 1, wherein the step of heating the precursor includes heating the precursor to higher than 150 degrees Celsius.

6. The method as recited in claim 1, wherein the step of heating the precursor includes heating the precursor in the presence of oxygen to form an oxide in areas exposed to the light.

7. The method as recited in claim 1, wherein the insulator includes a quinone.

8. The method as recited in claim 7, wherein the quinone includes 6,13-pentacenequinone, or a larger sibling material.

9. The method as recited in claim 1, wherein the semiconductor material includes pentacene.

10. The method as recited in claim 1, wherein the step of heating the precursor in the presence of light includes simultaneously heating and illuminating the precursor in selected regions with a light source and subsequently heating the precursor to form a semiconductor in non-illuminated regions.

* * * * *